(12) United States Patent
Ray et al.

(10) Patent No.: US 6,265,136 B1
(45) Date of Patent: Jul. 24, 2001

(54) LITHOGRAPHIC PLATE PRECURSOR

(75) Inventors: Kevin Barry Ray, Morley (GB); Alison Jane Brooks, West Yorkshire (GB); Gareth Rhodri Parsons, Morley (GB); Deborah Jane Firth, deceased, late of Wortley (GB), by Herbert S. Firth executor; Christopher David McCullough, Fort Collins, CO (US)

(73) Assignee: Kodak Polychrome Graphics LLC, Norwalk, CT (US)

(*) Notice: Subject to any disclaimer, the term of this patent is extended or adjusted under 35 U.S.C. 154(b) by 0 days.

(21) Appl. No.: 09/348,212

(22) Filed: Jul. 8, 1999

Related U.S. Application Data

(63) Continuation of application No. PCT/GB98/00134, filed on Jan. 15, 1998.

(30) Foreign Application Priority Data

Jan. 15, 1998 (GB) .................................................. 9700882

(51) Int. Cl.⁷ .............................. G03F 7/30; G03F 7/021
(52) U.S. Cl. .................... 430/302; 430/157; 430/158; 430/160; 430/175; 430/176; 430/944
(58) Field of Search .................................. 430/302, 175, 430/176, 944, 157, 158, 160

(56) References Cited

U.S. PATENT DOCUMENTS

| | | | |
|---|---|---|---|
| 3,664,737 | 5/1972 | Lipp | 355/18 |
| 3,997,349 | 12/1976 | Sanders | 96/75 |
| 4,248,959 | 2/1981 | Jeffers et al. | 430/300 |
| 4,486,529 | 12/1984 | Jeffers et al. | 430/300 |
| 4,533,620 | 8/1985 | Walls et al. | 430/157 |
| 4,812,384 | 3/1989 | Franke et al. | 430/175 |
| 5,122,442 | 6/1992 | Moskowitz et al. | 430/325 |
| 5,466,557 | * 11/1995 | Haley et al. | 430/278.1 |
| 5,491,046 | 2/1996 | DeBoer et al. | 430/302 |
| 5,618,649 | * 4/1997 | Vermeersch et al. | 430/168 |
| 5,663,031 | * 9/1997 | Hauqueir et al. | 430/159 |
| 5,663,037 | * 9/1997 | Haley et al. | 430/178.1 |
| 5,879,861 | * 3/1999 | Van Damme et al. | 430/302 |
| 5,922,502 | * 7/1999 | Damme et al. | 430/162 |
| 6,001,536 | * 12/1999 | Vermeersch et al. | 430/302 |
| 6,071,369 | * 6/2000 | Vermeersch et al. | 156/272.8 |
| 6,140,005 | * 10/2000 | Van Damme et al. | 430/156 |

FOREIGN PATENT DOCUMENTS

| | | |
|---|---|---|
| 2547221 | 5/1977 | (DE) . |
| 2725308 | 12/1977 | (DE) . |
| 0164128 | 12/1985 | (EP) . |
| 326714 | 5/1989 | (EP) . |
| 0625728 | 11/1994 | (EP) . |
| 2300354 | 10/1976 | (FR) . |
| 1586573 | 3/1981 | (GB) . |
| 1600871 | 10/1981 | (GB) . |
| 2277601 | 11/1994 | (GB) . |

OTHER PUBLICATIONS

WIPO Publication No. WO 99/00703.
WIPO Publication No. WO 98/32053.

* cited by examiner

*Primary Examiner*—John S. Chu
(74) *Attorney, Agent, or Firm*—Baker Botts L.L.P.

(57) ABSTRACT

There is described a method of preparing a lithographic plate which comprises coating on a lithographic support having a hydrophilic surface, a layer of a heat sensitive coating, digitally imaging the coating, then processing the plate with water to remove the unexposed areas of the coating to reveal the hydrophilic surface of the plate and to leave an ink receptive image, wherein the heat sensitive coating comprises a diazo salt of formula (I):

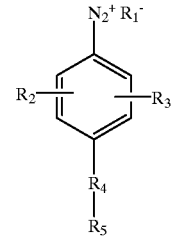

(I)

wherein $R_1$ is an anion, $R_2$ and $R_3$ represent optional substitution, $R_4$ is —N— or —S— and $R_5$ is a group which, after exposure of the plate, renders the residue of the diazo salt oleophilic and fount solution insoluble.

13 Claims, No Drawings

LITHOGRAPHIC PLATE PRECURSOR

This is a continuation of copending application Ser. No. PCT/GB98/00134 filed Jan. 15, 1998 which is incorporated by reference herein.

BACKGROUND OF THE INVENTION

This invention relates to a method of producing a lithographic plate precursor which is imageable by direct heat and processable with water.

Currently the commonest method of preparing a lithographic plate is to image a photosensitive lithographic plate to UV light and to prepare the plate therefrom using an aqueous developing solution.

The differentiation between image and non-image areas is made in the exposure process. In conventional lithography a film original is applied to the plate with a vacuum to ensure good contact and the plate is then blanket exposed to a light source, a portion of which is composed of UV radiation.

More recent developments in the field of lithographic printing plates have provided imaging devices which allow for the preparation of direct digitally written printing forms. In the commonest method digital imaging information is used to image the plate directly by laser radiation without the need to utilise an imaging master such as a photographic transparency. The fastest growing trend is to utilise lasers which emit infra-red radiation. Such imaging systems are, however, costly due to the lasers required and this is a contributing factor to the slow rate of uptake of this new imaging technology within the print industry. However, imaging devices are now available commercially which can image media using direct heat via means of a heated stylus or nib controlled by an image stored in a computer. Such devices are much cheaper than the equivalent laser imagers and are reducing the entry cost for direct plate imaging systems. Following the exposure the differentiation is revealed during the development step. For typical negative acting systems this involves washing away material from the plate which was not imaged by the exposing source with the aid of a developing solution which may be highly alkaline, e.g. pH of 13, and based on an organic solvent. When aqueous developing solutions comprising volatile organic solvents or which are strongly alkaline in nature are used, their use and disposal presents an environmental problem.

SUMMARY OF THE INVENTION

We have discovered a method of preparing a negative working lithographic printing plate which can be processed with pure water and which can be imaged using direct heat combining both the compatibility with low cost imaging systems and the environmental benefits of water-only processing.

According to the present invention there is provided a method of preparing a lithographic printing plate which comprises coating on a lithographic support having a hydrophilic surface a layer of a heat sensitive coating, imaging the coating by direct heat and then processing the plate with water to remove the unexposed areas of the coating, to reveal the hydrophilic surface of the plate and to leave an ink receptive image, wherein the heat sensitive coating comprises a diazo salt of the following formula:

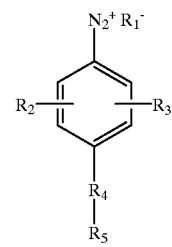

wherein $R_1$ is an anion, $R_2$ and $R_3$ represent optional substitution, $R_4$ is —N— or —S— and $R_5$ is a group which after exposure of the plate renders the residue of the diazo salt oleophilic and fount insoluble.

Usefully $R_1$ is sulphate, nitrate or chloride or it may be a more complex anion for example perfluorooctyl. $R_2$ and $R_3$ if present are preferably selected from an alkoxy, halogen, alkyl or amine. The presence of a substituent group in $R_2$ or $R_3$ helps to stabilise the diazo compound.

When $R_4$ is —N— it may be represented by

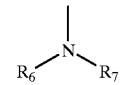

where $R_7$ and $R_6$ may be part of a polymer chain or may be part of a morpholino functional group.

Preferably however $R_6$ is hydrogen and $R_7$ is a group

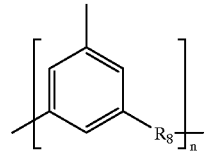

where $R_8$ is the residue of a condensing agent and n is 1 to 100.

Thus the group $R_7$ converts the diazo compound to a diazo resin and this helps to prevent the exposed diazo from washing off during processing.

Examples of diazo salts usefull in the present invention are as follows:

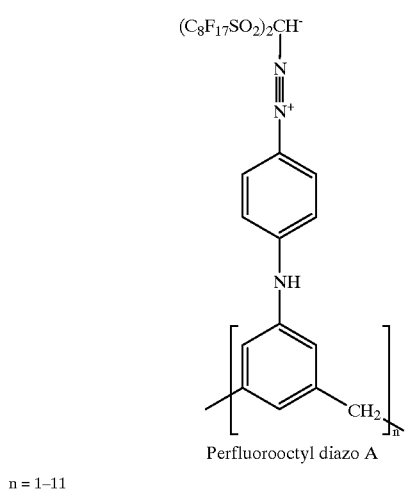

Perfluorooctyl diazo A
n = 1–11

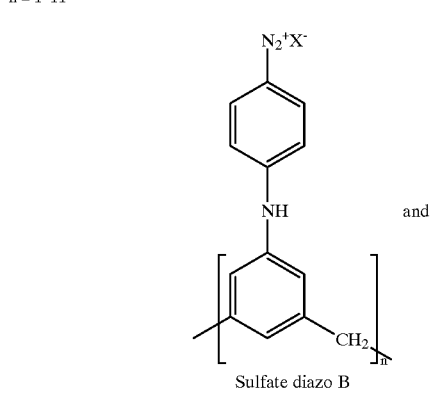

Sulfate diazo B
Where X = sulfate
n = 1–11

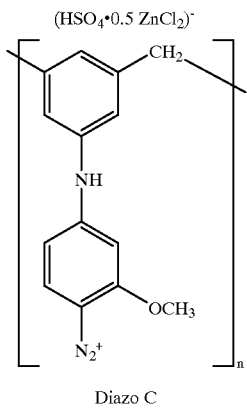

Diazo C

In a preferred method of the present invention the printing plate precursor is, imagewise heated using a direct heat source which is imagewise controlled by an image stored in a computer.

Preferably the heat sensitive coating comprises a compound capable of absorbing heat and transferring this into the bulk of the coating. The heat absorbing material may be carbon such as carbon black or graphite. It may be a commercially available pigment such as HELIOGEN® Green as supplied by BASF or Nigrosine Base NGI as supplied by NH Laboratories Inc. Usefully it may be an organic pigment or dye such as phthalocyanine pigment or it may be a dye or pigment of the squarylium, merocyanine, indolizine, pyrylium or metal dithioline classes.

Several types of support may be used for the manufacturing of a diazo sensitised lithographic printing plate. Common supports are metal supports like Al or Zn, polyester film supports and paper bases. These supports, if not sufficiently hydrophilic by themselves, are first coated with a hydrophilic layer to form the hydrophilic background of the printing plate and a top layer containing the diazo compound is then applied.

Preferably the support is a flexible support which is attached to a printing press after the direct imaging and water development of the image.

In a modification to the method of the present invention there is present between the hydrophilic surface of the support and the dried diazo coating solution a hydrophilic layer. This helps the water to remove the unexposed diazo coating more cleanly after the imagewise exposure.

Examples of such hydrophilic layers are layers composed of hydrophilic polysaccharides, for example dextran or pullulan.

DETAILED DESCRIPTION OF THE INVENTION

The following examples will serve to illustrate the invention.

The following products are referred to hereinafter:

Binder—Ronacoat OC15 having the structure:

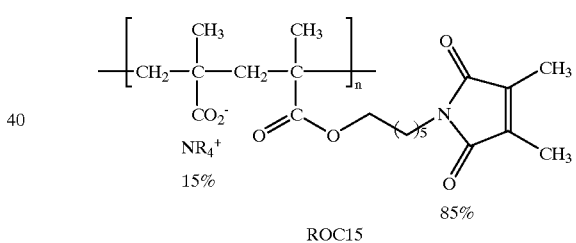

ROC15 as supplied by Rohner Ltd of Pratteln, Switzerland.

Diazo—TG-3 having the structure:

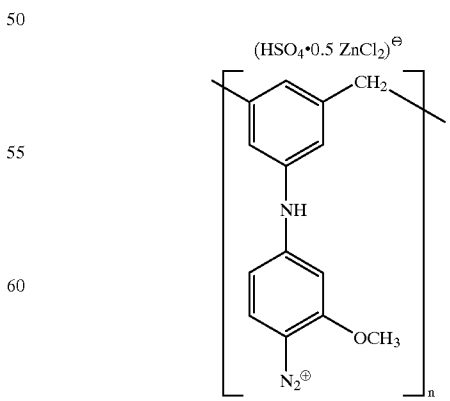

as supplied by PJS Chemicals of New York State, USA.

IR dye—IR-1 as supplied by Eastman Chemical Company, Rochester, N.Y., USA, having the structure:

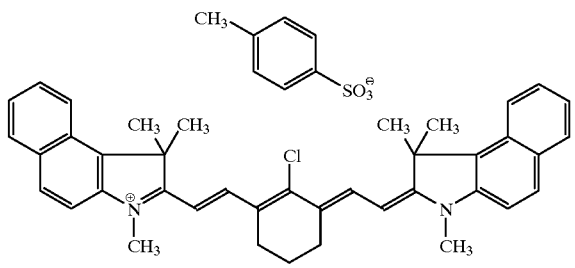

The coating formulation for the examples was prepared as a solution in 1-methoxy propan-2-ol/water 96:4 (v:v). The substrates used were:
a). 0.3 mm sheets of aluminum that had been electrograined and anodised and post-treated with an aqueous solution of an inorganic phosphate,
b). 0.18 mm sheets of Horsell Planfoil, a polyester montage foil.

The coating solutions were coated onto the substrate by means of a wire wound bar. The solution concentrations were selected to provide the specified dry film compositions with a coating weight of 1.3 $gm^{-2}$ after thorough drying at 80° C. in an oven for 2 minutes.

| Component | Parts by Weight |
|---|---|
| Binder | 71 |
| Diazo | 25 |
| IR Dye | 4 |

Exposure Method 1—Comparative Method Using a Laser Imaging Device

The coated aluminum substrate was cut into a circle of 105 mm diameter and placed on a disc that could be rotated at a constant speed of 2500 revolutions per minute. Adjacent to the spinning disc, a translating table held the source of the laser beam so that the laser beam impinged normal to the coated substrate, while the translating table moved the laser beam radially in a linear fashion with respect to the spinning disc. The exposed image was in the form of a spiral whereby the image in the centre of the spiral represented slow laser scanning speed and long exposure time and the outer edge of the spiral represented fast scanning speed and short exposure time. The laser used was a single mode 830 nm wavelength 200 mW laser diode which was focused to a 10 micron spot. The laser power supply was a stabilised constant current source.

Exposure Method 2—Direct Heat Method

Samples of the coated aluminum substrate were subjected to heat delivered from a Weller Soldering Iron $EC_{2100}$ M at 316° C. The desired image, was created by manually moving the soldering iron over the coating to imagewise solubilise the coating by direct heat and produce the image differentiation. The speed of movement of the soldering iron over the plate surface was 1 cm $s^{-1}$ and the heat was applied to the coated face of the plate.

Exposure Method 3—Direct Heat Imagewise Controlled by a Computer

Samples of the coated polyester substrate were subjected to heat delivered from a thermal paper exposing head controlled by a computer attached to a Perkin-Elmer 881 IR spectrophotometer.

Processing After Imaging

All plate samples were developed by immersing in water which removed the non-imaged coating areas leaving exposed image areas.

Results

| Exposure Method | Result |
|---|---|
| 1 | The imaging density required to give a useful image was 450 mJ $cm^{-2}$ |
| 2 | Coating totally removed in areas NOT subjected to heat, leaving a water insoluble imaged area. |
| 3 | Coating totally removed in areas NOT subjected to heat, leaving a water insoluble imaged area. |

What is claimed is:

1. A method of preparing a lithographic printing plate using a precursor which comprises on a lithographic support having a hydrophilic surface a layer of a heat sensitive coating, imaging the coating by direct heat and then processing the plate, wherein the plate is processible with pure water to remove the unexposed areas of the coating, to reveal the hydrophilic surface of the plate and to leave an ink receptive image, and wherein the heat sensitive coating comprises a diazo salt of the following formula:

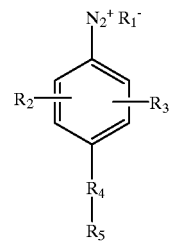

(I)

wherein $R_1$ is an anion, $R_2$ and $R_3$ represent optional substitution, $R_4$ is —N— or —S— and $R_5$ is a group which after exposure of the plate renders the residue of the diazo salt oleophilic and fount insoluble.

2. The method according to claim 1 wherein $R_1$ is sulphate, nitrate, chloride or perfluorooctyl.

3. The method according to claim 1 wherein $R_2$ and $R_3$ when present are selected from the group consisting of alkoxy, halogen, alkyl, and amine.

4. The method according to claim 1 wherein when $R_4$ is —N— the moiety —$R_4$—$R_5$ is of the formula:

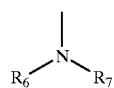

where $R_7$ and $R_6$ are part of a polymer chain or are part of a morpholino functional group.

5. The method according to claim 1 wherein when $R_4$ is —N— the moiety —$R_4$—$R_5$ is of the formula:

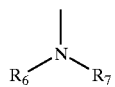

where $R_6$ is hydrogen and $R_7$ is a group of the formula:

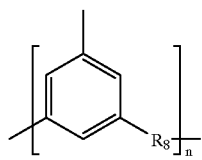

where $R_8$ is the residue of a condensing agent and n is 1 to 100.

6. The method according to claim 1 wherein the direct heat source is controlled by an image stored in a computer.

7. The method according to claim 1 wherein the heat sensitive coating further comprises a heat absorbing compound.

8. The method according to claim 7 wherein the heat absorbing compound is a pigment.

9. The method according to claim 8 wherein the pigment is selected from the group consisting of carbon black, nigrasine, green and graphite.

10. The method according to claim 8 wherein the pigment is an organic pigment.

11. The method according to claim 7 wherein the heat absorbing compound is a dye selected from the group consisting of the squarylium, merocyanine, indolizine, pyrylium, and metal dithioline classes.

12. The method according to claim 1 wherein the lithographic support is Al, Zn, polyester film or a paper base.

13. The method according to claim 12 further comprising treating or coating the surface of the support to render the support hydrophilic.

* * * * *

UNITED STATES PATENT AND TRADEMARK OFFICE
CERTIFICATE OF CORRECTION

PATENT NO. : 6,265,136 B1
DATED : July 24, 2001
INVENTOR(S) : Ray et al.

It is certified that error appears in the above-identified patent and that said Letters Patent is hereby corrected as shown below:

Column 2,
Line 30, "sulphate," should read -- sulfate, --
Line 66, "usefull" should read -- useful --

Column 5,
Line 58, "$EC_{2100}M$" should read -- EC 2100M --
Line 59, "image," should read -- image --

Column 6,
Line 30, "processible" should read -- processable --

Column 8,
Line 9, "nigrasine" should read -- nigrosine --

Signed and Sealed this

Twenty-fifth Day of June, 2002

Attest:

Attesting Officer

JAMES E. ROGAN
Director of the United States Patent and Trademark Office